(12) United States Patent
Rose et al.

(10) Patent No.: US 7,592,191 B2
(45) Date of Patent: Sep. 22, 2009

(54) FIELD EMISSION BACKPLATE

(75) Inventors: Mervyn John Rose, Perthshire (GB);
Ravi Silva, Camberley (GB); John Shannon, Surrey (GB)

(73) Assignee: The University Court of the University of Dundee, Dundee (GB)

( * ) Notice: Subject to any disclaimer, the term of this patent is extended or adjusted under 35 U.S.C. 154(b) by 0 days.

(21) Appl. No.: 10/773,696

(22) Filed: Feb. 6, 2004

(65) Prior Publication Data

US 2004/0197942 A1 Oct. 7, 2004

Related U.S. Application Data

(63) Continuation of application No. PCT/GB02/03691, filed on Aug. 9, 2002.

(30) Foreign Application Priority Data

Aug. 11, 2001 (GB) ................................ 0119657.5
Aug. 11, 2001 (GB) ................................ 0119659.1

(51) Int. Cl.
*H01L 21/00* (2006.01)
(52) U.S. Cl. .................... 438/20; 438/149; 313/503; 313/309
(58) Field of Classification Search ................ 438/149, 438/20; 313/503, 309
See application file for complete search history.

(56) References Cited

U.S. PATENT DOCUMENTS

| 5,090,932 | A | | 2/1992 | Dieumegard et al. ........... 445/24 |
|---|---|---|---|---|
| 5,094,975 | A | | 3/1992 | Siu ............................... 437/89 |
| 5,329,207 | A | * | 7/1994 | Cathey et al. ............. 315/169.1 |
| 5,804,910 | A | | 9/1998 | Tjaden et al. ................ 313/310 |
| 5,804,919 | A | * | 9/1998 | Jacobsen et al. ............. 313/506 |
| 6,451,631 | B1 | * | 9/2002 | Grigoropoulos et al. ..... 438/149 |
| 6,635,932 | B2 | * | 10/2003 | Grigoropoulos et al. ..... 257/359 |
| 7,247,527 | B2 | * | 7/2007 | Shimomura et al. ......... 438/149 |
| 7,304,420 | B2 | * | 12/2007 | Rose et al. ................... 313/309 |
| 7,358,165 | B2 | * | 4/2008 | Shoji et al. .................. 438/487 |
| 2003/0003636 | A1 | * | 1/2003 | Grigoropoulos et al. ..... 438/149 |
| 2004/0197942 | A1 | * | 10/2004 | Rose et al. ..................... 438/20 |
| 2005/0023531 | A1 | * | 2/2005 | Shoji et al. ..................... 257/70 |
| 2005/0026401 | A1 | * | 2/2005 | Shimomura et al. ......... 438/487 |
| 2005/0115930 | A1 | * | 6/2005 | Tanaka et al. ............. 219/121.6 |
| 2005/0139786 | A1 | * | 6/2005 | Tanaka et al. ............. 250/492.2 |

(Continued)

FOREIGN PATENT DOCUMENTS

EP 0 726 589 A1 8/1996

(Continued)

*Primary Examiner*—Laura M Menz
(74) *Attorney, Agent, or Firm*—Winston & Strawn LLP

(57) ABSTRACT

A field emission backplate formed by laser crystallizing of an area of amorphous semiconductor based material. Emitter sites result from the rough surface texture caused by the crystallization process. The crystallization may be localized using laser interferometry, and profiled emitter tips grown on the localized crystalline areas. Such backplates can be used in field emission devices emitting into either a vacuum or a wide band gap light-emitting polymer. Furthermore, a backplate having self-aligned gates can be formed by depositing an insulator layer and a metal layer over the emitter tips, removing the top of the metal layer and etching away the insulator, leaving each tip surrounded by a metal rim. A planarizing agent can be used to refine this process.

36 Claims, 8 Drawing Sheets

U.S. PATENT DOCUMENTS

| | | | |
|---|---|---|---|
| 2005/0179366 A1* | 8/2005 | Rose et al. | 313/503 |
| 2006/0240734 A1* | 10/2006 | Chen | 445/50 |
| 2006/0246693 A1* | 11/2006 | Tanaka et al. | 438/487 |
| 2007/0284991 A1* | 12/2007 | Egi et al. | 313/479 |
| 2008/0042926 A1* | 2/2008 | Egi et al. | 345/32 |
| 2008/0050851 A1* | 2/2008 | Tanaka et al. | 438/29 |
| 2008/0074031 A1* | 3/2008 | Yan | 313/496 |
| 2008/0135848 A1* | 6/2008 | Yamazaki et al. | 257/66 |
| 2008/0165315 A1* | 7/2008 | Nishida et al. | 349/137 |
| 2008/0182349 A1* | 7/2008 | Yamazaki et al. | 438/29 |

FOREIGN PATENT DOCUMENTS

| | | |
|---|---|---|
| EP | 1 047 095 | 10/2000 |
| EP | 1 094 485 | 4/2001 |
| GB | 2 378 569 A | 2/2003 |
| GB | 2 378 570 A | 2/2003 |
| JP | 7073800 | 3/1995 |
| JP | 7141984 | 6/1995 |
| JP | 2002110544 | 4/2002 |
| WO | EP 0 578 428 | 1/1994 |
| WO | WO 02/080215 A2 | 10/2002 |

* cited by examiner

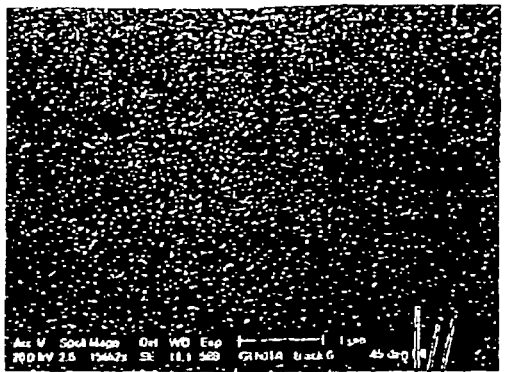
12a — Fig.1A — 20a
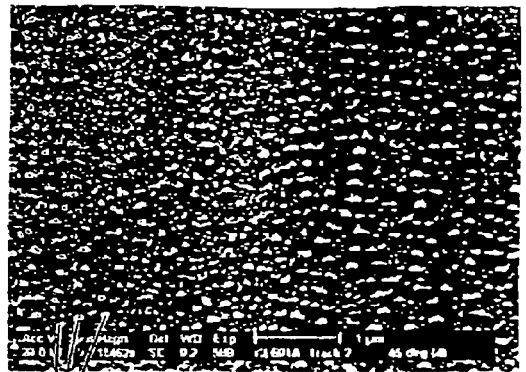
20d — Fig.1D — 12d
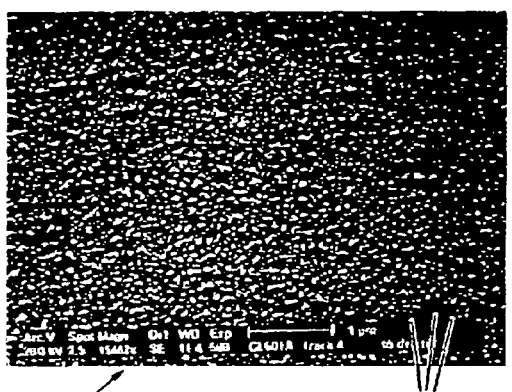
12b — Fig.1B — 20b
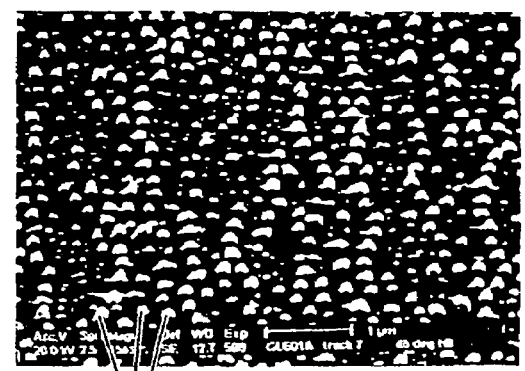
20e — Fig.1E — 12e
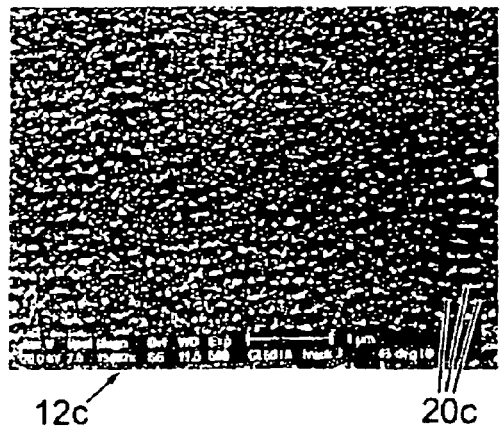
12c — Fig.1C — 20c
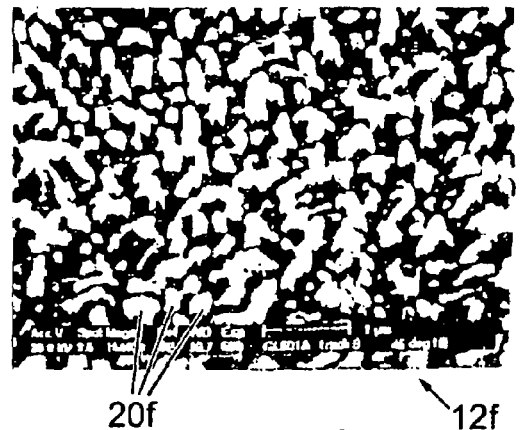
20f — Fig.1F — 12f

FIELD EMISSION BACKPLATE

CROSS-REFERENCE TO RELATED APPLICATIONS

This application is a continuation of International application PCT/GB02/03691 filed Aug. 9, 2002, the entire content of which is expressly incorporated herein by reference thereto.

FIELD OF INVENTION

The present invention relates to a field emission backplate and to a related arrangement and method of manufacture. In particular, though not exclusively, the invention relates to a field emission backplate comprising a plurality of emission sites of "silicon tips" formed by laser crystallisation and selective regrowth. The invention finds use in displays.

BACKGROUND TO INVENTION

Flat panel displays are of immense importance in electronics. In current developments, Active Matrix Liquid Crystal Displays (AMLCD) are beginning to challenge the dominance of Cathode Ray Tube (CRT) technology. AMLCD devices are non-emissive and require complex lithography. Filters and matching spectral backlights are required to produce colour. However, there are many light losses and inherent complexity in AMLCD devices because of the non-linear nature of liquid crystal materials. This results in a display that is less bright than CRT with a smaller colour gamut and poorer viewing angle and contrast. Also, due to the non-emissive nature of the display, inefficient use of input electrical power is made often with well over 70% of the energy being lost as non-useful energy.

Field emission displays, based on conventional 'Spindt Tip' technology, promised a solution to flat panel display problems. Field emission displays (FEDs) are essentially flat cathode ray tube (CRT) devices. However, rather than one electron gun firing electrons at a phosphor on a screen through a shadow mask, the FED has tens or hundreds of individual tip in each display pixel. The tips are known as Spindt tips, after the inventor Cap Spindt. The process of fabrication relies on defining a pattern of holes in a gate metal by photolithography. An underlying insulator is then etched in an isotropic wet etch that "undercuts" leaving a well beneath the metal. A sacrificial layer (usually nickel) is then evaporated on the surface at an oblique angle to ensure the well is not filled. The emitter material (usually tungsten or molybdenum) is then evaporated through the holes in to the well. As the evaporate metal builds up on the surface, on the sacrificial layer, it closes the hole as the thickness increases, and has the effect of providing an emitter tip in the well. The top metal is then removed by etching the sacrificial layer, leaving the tip, the well, and the original gate metal. This forms the backplate of Spindt tips. A top plate containing a patterned phosphor is then placed relative to the backplate using spacers. The final device is evacuated to allow the emitted electrons a long mean free path. The principle of field emission from micro-tips is well understood and is governed by Fowler-Nordheim tunneling. The emission current, and therefore brightness of the display, depends then only on the current density, the number of tips and their sharpness, i.e.

$$I = J_{FN} n \alpha$$

Where n=number of tips, $\alpha$ the tip sharpness and $J_{FN}$ the Fowler-Nordheim tunnel current density.

The tips will provide a sharp electron source that will provide hot electron injection into, for example, a phosphor.

Unfortunately, the extreme complication in fabrication has limited the use of this technology. Additionally, crystal silicon emitters are limited by the wafer size.

Other thin-film materials may also be used for field emission. Carbon is the main contender with diamond, diamond like carbon and carbon nano-tubes also suitable. The use of diamond seemed a good choice, although this is difficult to fabricate and also the mechanism of a supposed negative electron affinity which diamond was claimed to have has now been questioned.

An object of at least one embodiment of at least one aspect of the present invention is to obviate or at least mitigate at least one of the aforementioned problems in the prior art.

SUMMARY OF INVENTION

According to a first aspect of the present invention there is provided a method of forming a field emission backplate comprising:

providing a planar body of amorphous semiconductor based material upon a substrate; and laser crystallising at least a portion of the amorphous semiconductor based material;

wherein upon crystallising the amorphous semiconductor based material a plurality of emitter sites are formed.

Preferably the planar body of amorphous semiconductor based material is provided by depositing a thin film of the material upon a substrate.

Conveniently, the semiconductor based material is silicon or an alloy thereof.

Preferably the laser crystallising is performed using an excimer laser or Nd:YAG laser.

Conveniently, the excimer laser is a KrF laser.

It will be understood that in the context of the present invention the term "thin film" is used to define a film of a few nanometers, for example, 1 to 100 nm, and typically 10 nm.

According to a second aspect of the invention there is provided a field emission backplate comprising a plurality of emitter sites formed by laser crystallisation of a thin film of amorphous semiconductor based material.

Conveniently, the semiconductor based material is silicon or an alloy thereof.

According to a third aspect of the invention there is provided a field emission device comprising a field emission backplate having a plurality of emitter sites formed by laser crystallising of a thin film of amorphous semiconductor based material.

The field emission device may be a vacuum device wherein the emitter sites of the back plate act as an emission sources in the device.

Conveniently, the field emission device comprises a substrate, a field emission backplate, and an evacuated space and a transparent window, e.g. thin film transparent metal or metallised phosphor, wherein the field emission backplate is formed upon the substrate and the evacuated space is located between the field emission backplate and the thin film transparent metal or metallised phosphor.

Alternatively, the field emission device comprises a wide band-gap light emitting material, eg light emitting polymer into which electrons from the emitter sites of the backplate are emitted.

Conveniently, the field emission device comprises a substrate, a field emission backplate, on one side of which is formed a plurality of emitter sites, a light emitting polymer and a thin film transparent metal or metallised phosphor wherein the field emission backplate is formed upon the substrate, one surface of the light emitting polymer is disposed on the plurality of emitter sites of the field emission backplate, the thin film transparent metal being disposed on the other surface of the light emitting polymer.

Conveniently, the field emission device is a display device.

According to a fourth aspect of the present invention there is provided a field emission backplate comprising a plurality of grown tips, the backplate being made substantially from semiconductor based material.

Preferably the plurality of tips are formed on a thin film of semiconductor based material.

Preferably the grown tips are "profiled", that is to say grown in a manner resulting in a sharp pointed shape.

Conveniently, the tips are grown and etched simultaneously.

Conveniently, the semiconductor based material is silicon or an alloy thereof.

According to a fifth aspect of the present invention there is provided a field emission backplate comprising a planar member of substantially amorphous material and a plurality of tips of crystalline material thereon.

Preferably the tips are formed on crystalline or crystallised areas of the planar member.

According to a sixth aspect of the invention there is provided a field emission backplate comprising a plurality of grown tips, the backplate being made substantially from a thin film silicon based material.

Preferably the plurality of tips are formed by the growth of crystalline silicon on a plurality of crystallized areas of the thin film of amorphous silicon.

According to a seventh aspect of the invention there is provided a field emission device having a backplate comprising an array of (profiled) tips formed by the selective growth of crystalline semiconductor based material on a plurality of crystallized areas of a thin film or amorphous semiconductor based material.

The field emission device may be a vacuum device wherein the emitter tips of the backplate act as an emission source in the device.

Conveniently, the field emission device comprises a substrate, a field emission backplate, an evacuated space and a transparent window, e.g. thin film transparent metal, wherein the field emission backplate is formed upon the substrate and the evacuated space is located between the field emitting backplate and the thin film transparent metal.

Alternatively, the field emission device may comprises a wide band-gap light emitting material, e.g. light emitting polymer into which electrons from the emitter tips of the backplate are emitted in use.

Conveniently, the field emission device comprises a substrate, a field emission backplate, on one side of which is formed a plurality of tips, a light emitting polymer and a thin film transparent metal wherein the field emission backplate is formed upon the substrate, one surface of the light emitting polymer is disposed on the plurality of tips of the field emission backplate, the thin film transparent metal be disposed on the other surface of the light emitting polymer.

Conveniently the field emission device is a display device.

Preferably, the tips of the field emission backplate of the display device are of a density of at least 100 per square micron.

According to an eighth aspect of the invention there is provided a method of forming a field emission backplate comprising:

depositing a thin film of amorphous semiconductor based material upon a substrate;

locally crystallizing a plurality of areas of the thin film amorphous semiconductor based material; and growing crystalline semiconductor based material upon each of the plurality of crystallized areas of thin film amorphous semiconductor based material.

Conveniently the thin film of amorphous semiconductor based material is deposited on a substrate e.g. by plasma enhanced chemical vapour deposition (PECVD).

Preferably the plurality of areas of thin film amorphous semiconductor based material are crystallized by exposure to at least one pulse of a laser interference pattern.

According to a ninth aspect of the invention there is provided a method of crystallizing areas of thin film amorphous semiconductor based material for use in a field emission backplate comprising:

forming a laser interferometer by splitting and recombining a laser beam;

placing the thin film of amorphous semiconductor based material in a plane of recombination of the laser beam;

locally crystallizing areas of the thin film of amorphous semiconductor based material by subjecting the thin film to at least one laser pulse, wherein the crystallised areas generated in the thin film amorphous semiconductor based material correspond to the interference pattern of the laser.

Preferably, for a backplate of amorphous semiconductor based material wherein the semiconductor based material is hydrogenated amorphous silicon, the laser operates at a wavelength of around 532 nm to maximise absorption and preferably the laser is a Nd:YAG laser.

BRIEF DESCRIPTION OF DRAWINGS

These and other aspects of the invention will become apparent from the following description when taken in combination with the accompanying drawings which show:

FIGS. 1A-1F a thin film semiconductor crystallised at various energies according to the present invention;

DETAILED DESCRIPTION OF DRAWINGS

With reference initially to FIGS. 1A-1F there is shown photographic images of field emission backplates 12a to 12f each formed of an amorphous semiconductor based material, in this case n-type hydrogenated amorphous silicon, on the surface of which a plurality of emitter sites 20a-20f are formed. The field emission backplate 12a-12f is formed by the deposition of a thin film of approximately 100 nm of n-type hydrogenated amorphous silicon onto a substrate of, for example, aluminium by plasma enhanced chemical vapour deposition (PECVD). The deposited thin film then undergoes laser crystallisation by an excimer laser or Nd:YAG laser, in this case a KrF laser operating at a wavelength of 248 nm scanning at 2 mm\s in an atmosphere of oxygen and then quenched. Alternatively a Nd:YAG laser operating at a wavelength of 532 nm is used. The laser is pulsed at 3 to 7 nanoseconds and stepped and repeated to form a pattern. This process results in the surface of the silicon having a rough texture. The energy absorbed by the silicon influences the extent of roughening of the surface as can be seen in FIGS. 1A-1F, with FIG. 1A showing the emitter tips 20a which are the resultant effect of a small amount of absorbed energy i.e. approximately 100 mJ\cm$^-$. This can be compared to FIG. 1F which shows the rounded emitter tips 20f achieved by a relatively large amount absorbed energy, in the region of 300 mJ\cm$^-$. In each case, each of the tips 20a-20f acts as an emitter site. When the backplate 12 is incorporated in a field emission device (not shown), each emitter site 20a-20f emits electrons at low fields in a field emission configuration. The backplate 12a-12f results in emission currents in excess of $10^{-6}$A and low field threshold of around 10 V/μm.

Figure 2:
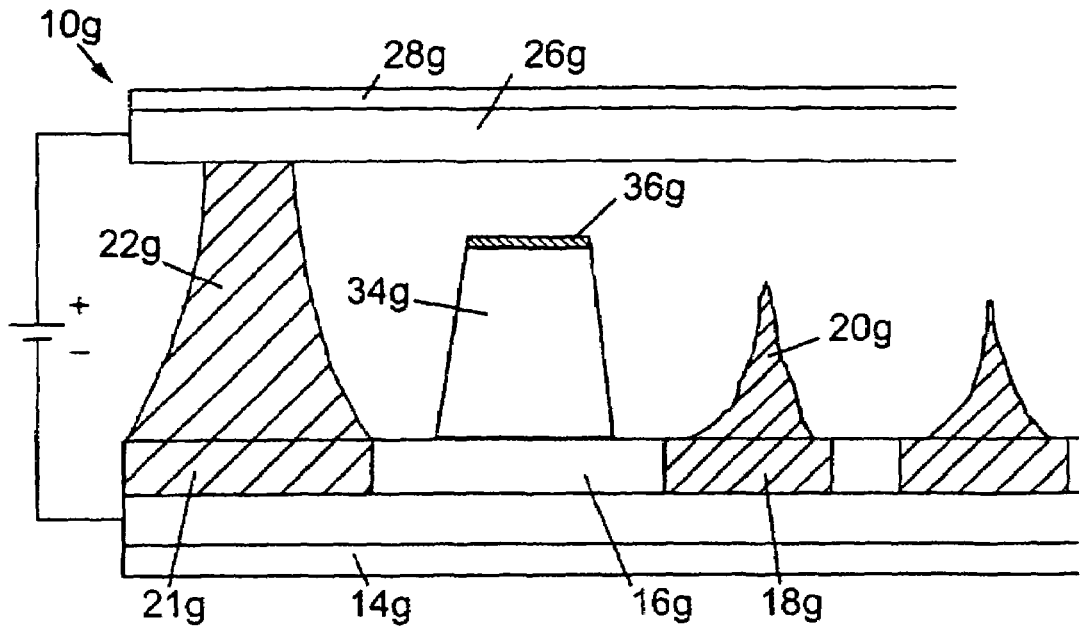
FIG. 2 a field emission device according to a first embodiment of the present invention.

An example first embodiment field emission device 10g, having a field emission backplate 12g formed as described with reference to FIGS. 1A-1F, is shown in FIG. 2. The device 10g shown is a triode device having a field emission backplate 12g with a substrate 14g of aluminium and a thin film 16g of n-type hydrogenated amorphous silicon which has been treated by an excimer laser and thus has a plurality of emitter sites 20g upon the surface. An insulating layer, for example, a layer of an insulating material such as silicon nitride, has been disposed on the crystallised silicon, and subsequently etched thus providing spacer elements 22g. Upon each of these spacer elements 22g is disposed a thin film 26g of phosphor, e.g. metallised phosphor and the device is completed with a layer of glass 28g thus giving a three terminal gate control arrangement. The area 24g between the glass 28g and the emitter sites 20g is evacuated which allows the emission to be controlled using low voltages and this is important for effective spacial control when the device 10g is used in display arrangements.

Figure 3:
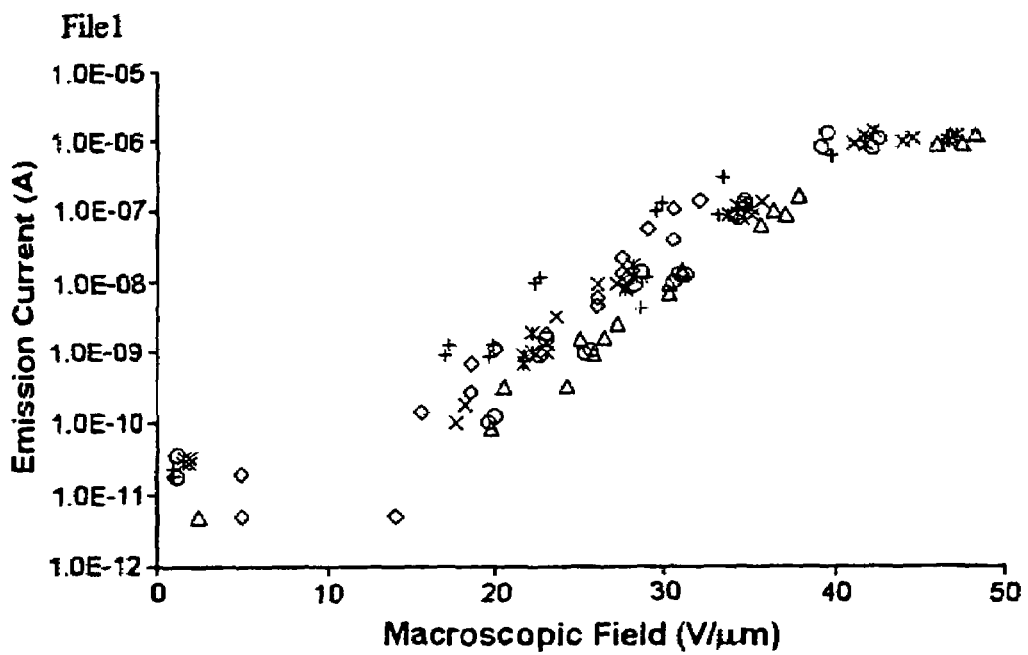
FIG. 3 a graph of field emission current vs electric field for a field emission backplate of the field emission device of FIG. 2.

Emission currents measured in such a device 10g having a vacuum below $5\times10^-$mbars are shown in FIG. 3 which is a graphical representation of the emission current vs the electric field. It is also estimated that the beta factor for the described device 10g is in excess of 450 with this figure including both geometric enhancement and internal enhancement.

Figure 4:
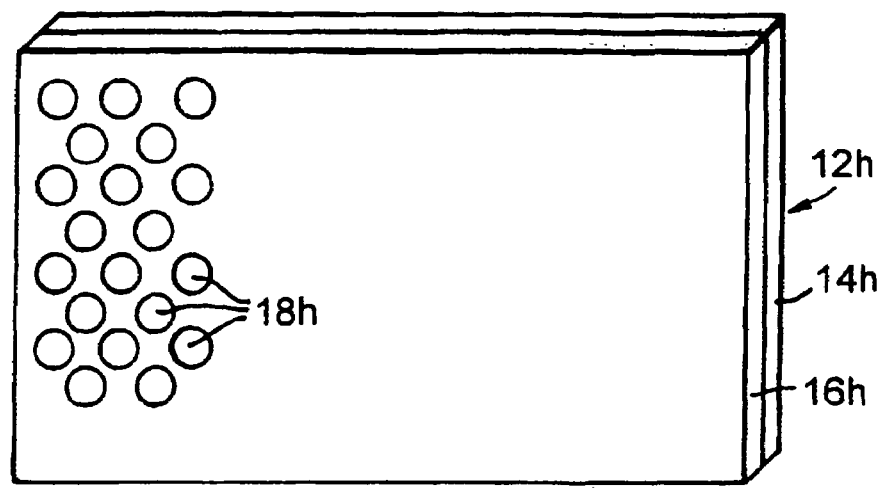
FIG. 4 a schematic perspective view of a thin film of amorphous silicon onto which is projected a laser interference pattern in forming a field emission backplate.

In FIG. 4, there is shown a thin film of amorphous silicon 16h disposed upon a substrate of aluminum 14h wherein a pattern of dots 18h caused by a laser interference pattern can be seen upon a region of surface of the silicon 16h. This arrangement illustrates a refinement of the technique used to form a backplate such as that of the first embodiment, the technique being used to produce a field emission backplate.

The thin film of amorphous silicon 16h is disposed upon the substrate of aluminum 14h by plasma enhanced chemical vapour deposition (PECVD). A Nd:YAG pulse laser, having a pulsing duration in the region of 3 to 7 nanoseconds, is used to form an interferometer, with the beam being split and brought back together forming a pattern of dots 18h. The thin film silicon layer 16h is positioned in a plane in which the interference pattern of the laser is formed. The laser interference pattern acts upon the silicon layer 16h creating areas, or dots 18h, of crystallization. A single pulse of an Nd:YAG laser is used to locally crystallize the region. The laser beam is synchronised with a step end repeat system in the plane of the thin film silicon 16h resulting in the formation of laser spots, and hence the crystallised dots 18h, distributed over the entire surface plate of the thin film silicon 16h, thus allowing a high density of tips to be made. By using this step and repeat system the backplate 12h may be made of any chosen size. An area of 30 μm×30 μm is typical for an individual pixel, and hence a micro tip density of 300×300, which equals $9\times10^4$, per Red Green Blue (RGB) pixel will be achieved. Such density of emitters is of crucial importance as the emission current of a field emission device depends on the number of tips and their sharpness.

A selective etch and growth process involving a dilute silane/hydrogen plasma forms micro crystalline silicon by allowing strained bonds within a silicon array, to be broken by the mobile hydrogen while deposited silicon atoms form thermodynamically stable crystalline sites. To form emitter tips 20h upon the laser treated thin film silicon 16h, resulting in a cross-section of tips 20h such as those shown in FIG. 5, the PECVD deposited thin film silicon 16h is subjected to a dilute silane/hydrogen plasma in a reactor.

During this process, deposition of silicon atoms will only take place on a crystalline substrate and therefore in this case upon the crystallised dots 18h of the thin film silicon 16h. Amorphous or weak bonded areas of the structure are simultaneously etched. Continued growth has the effect of profiling the edges of the growing film where the etching effect is more dramatic. As each crystalline area 18h is limited in size to less than 100 nm, the aspect ratio is such that the edges converge. Therefore, each circular dot 18h of 100 nm or less of the emitter plate 12h effectively grows a profile tip 20h. The growth and etching processes are mediated by mobile hydrogen and the aspect ratio profiling etching leading to sharp tips 20h over the entire growing surface of the plate of thin film silicon 16h. This profiling leads to field enhancement of the emission plate 12h which therefore gives a low threshold (of around 15 v/μm) for field emission and thus higher emission current (i.e. in excess of $10^-$amps) than that achievable with the field emission backplate of the first embodiment.

Figure 5:
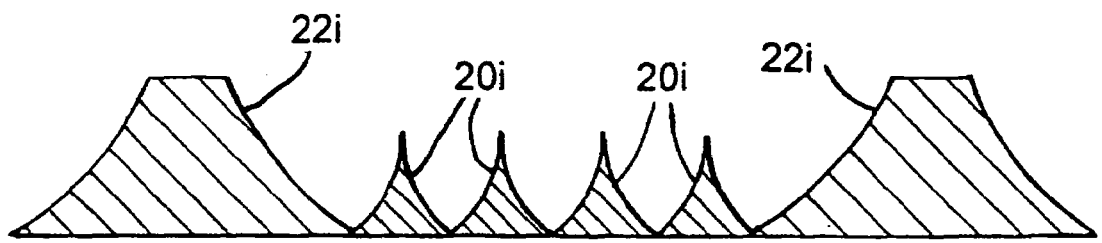
FIG. 5 a cross-section of a side profile of a grown crystalline silicon backplate according to a second embodiment of the present invention.

A cross-section of such grown tips 20i is shown in FIG. 5 as is a cross-section of spacers 22i which have been formed by allowing the pulsed laser to rest upon certain areas of the thin film silicon to create line or dot crystalline structure (not shown) that have dimensions much bigger than those of the emitter dots (not shown). This results in a thicker deposited film being formed upon these crystalline areas. Thus spacers 22i are grown at the time as the emitter tips 20i, allowing placement of gates for three terminal devices.

As the emission current, and therefore the brightness of the display depends upon the current density, the number of tips, and their sharpness, according to $I=J_{FN}$ nα. The tips provide a sharp electron source that, when incorporated within a device 10, will provide hot electron injection into the light emitting layer of the device either through an evacuated space 24 or into a wide band-gap light emitting material 25. Each electron gains energy from the applied field, that is the field which is applied across the device 10 with aluminum substrate 12 acting as an electrode.

Figure 6:
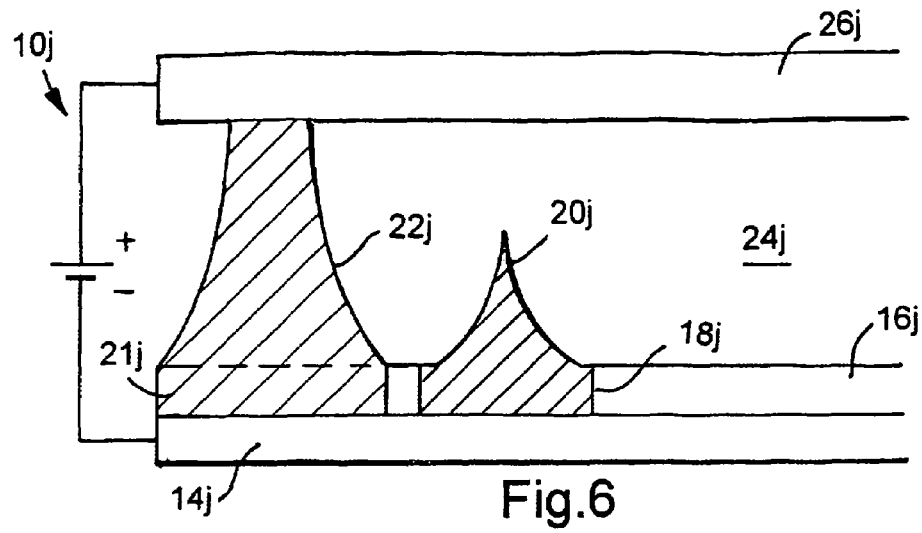
FIG. 6 a schematic side view of a field emission device having crystalline silicon tips according to a third embodiment of the present invention.

A field emission device configuration 10j having crystallised silicon emitter tips 20j formed as described with reference to FIGS. 4 and 5 is shown in FIG. 6.

The field emission device 10j is a vacuum device having grown spacers 22j on the micron scale. The substrate 14j is formed of aluminium onto which the thin film semiconductor based material 16j, in this case thin film hydrogenated amorphous silicon, is disposed by PECVD. As has been detailed previously, a plurality of areas 18j, 21j of the hydrogenated amorphous silicon are crystallised by a laser interferometer and, using the growth and etch system, tips 20j and spacers 22j are grown. A plate of patterned Indium Tin Oxide (ITO) 26j, disposed on a glass substrate 28j, is arranged to sit on the grown spacers 22j of the emitter backplate 12j. The area 24j between the emitter tips 20j and the ITO 26j is evacuated.

Figure 7:
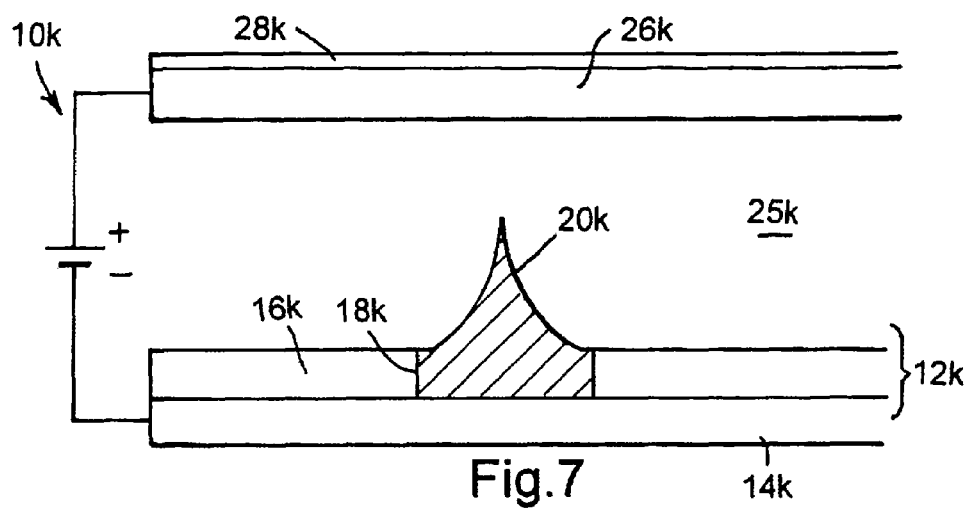
FIG. 7 a schematic side view of a field emission device having crystalline silicon tips according to a fourth embodiment of the present invention.

An alternative field emitting device 10k is shown in FIG. 7. In this configuration the field emitting device 10k is arranged with a wide band-gap light emitting material 25k, in this case a polymer, disposed on top of the field emission tips 20k for use as the light emitting medium. A diode configuration is fabricated with a thin film transparent metal such as Indium Tin Oxide (ITO) 26k disposed on a glass substrate 28k. The device 10k has the field emission backplate 12k formed of silicon 16k disposed on a substrate 14k which in this case is aluminium. The thin film (in the order of many microns) of wide band-gap light emitting polymer 25k is disposed upon the plate of patterned ITO 26k on glass substrate 28k by, for example, screen printing. The light emitting polymer 25k is then pressed onto the crystalline silicon tips 20k of the backplate 12k. An Al—Si-polymer-ITO diode structure is thus formed with the polymer 25k being cured upon baking the device 10k to a temperature of approximately 100° C. Such a device arrangement is particularly useful in the case of the thin film semiconductor not being of n-type and there being no low barrier metal that enables electrons to be injected.

A further alternative field emission device 10l, including a metal coated phosphor layer member 30l disposed on a face plate 32l, is shown in FIG. 7. The device 10l is further adapted to form a triode configuration by the deposition of an insulator 34l with a metal gate 36l placed above.

Figure 9A:
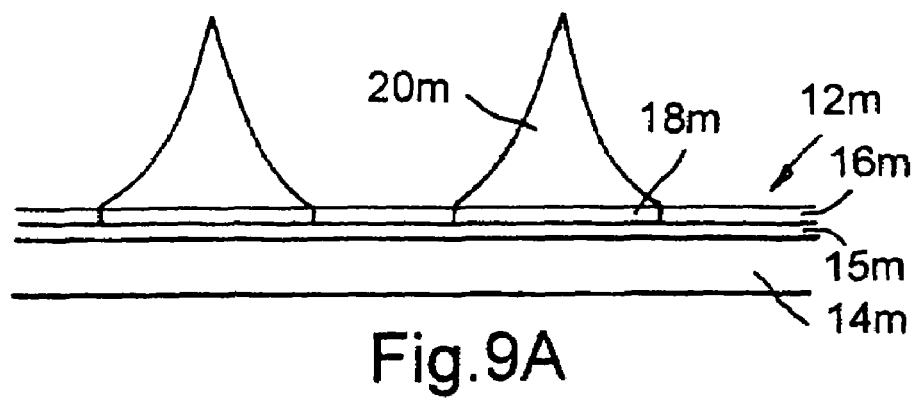
FIGS. 9A-9E a series of side cross-sectioned views showing a method of forming a field emission backplate according to a sixth embodiment of the present invention.

A yet further embodiment of a field emission backplate 12m involves constructing a three terminal device having self-aligned gates for each emitter 20m. This field emission backplate is constructed in a manner illustrated in FIGS. 9A-9E. In FIG. 9A there is shown a backplate 12m formed of a substrate 14m, metal cathode 15m and a thin film of amorphous silicon 16m. The thin film silicon 16m is laser crystallised in the manner described with reference to FIGS. 1A-1F using an Nd:YAG laser with emission tips 20m formed by the crystallisation process as detailed previously.

Figure 9B:
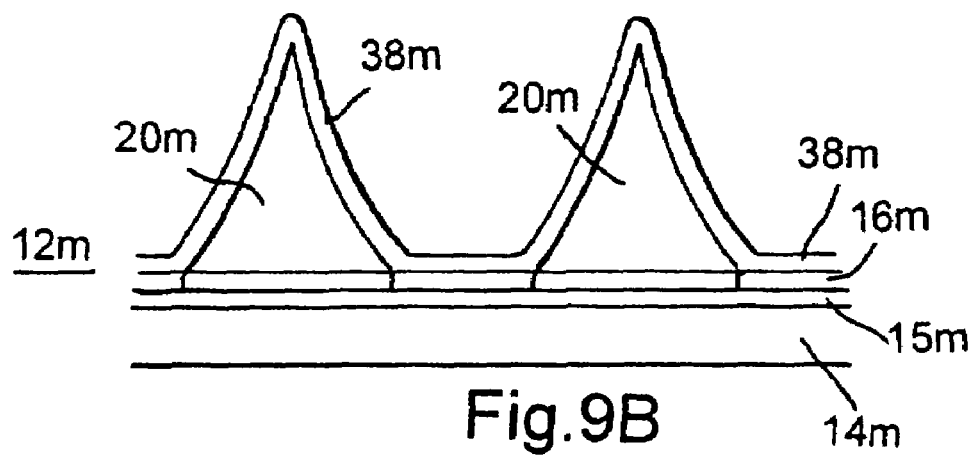

The first step of forming the self aligned gates involves forming by deposition a thin SiN (Silicon Nitride) insulator 38m, using PEVCD, upon the exposed surface of crystallised silicon completely encapsulating each of the emitter tips 20m as is illustrated in FIG. 9B.

Figure 9C:
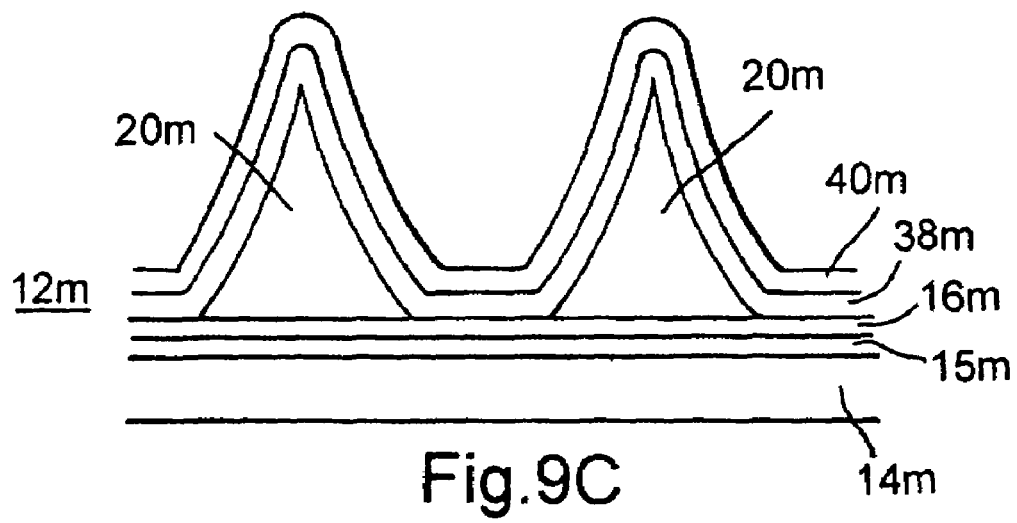

The second step of the process, the results of which are shown in FIG. 9C, involves a layer of metal 40m, in this case chromium, being deposited on top of the SiN layer by thermal evaporation.

Figure 9D:
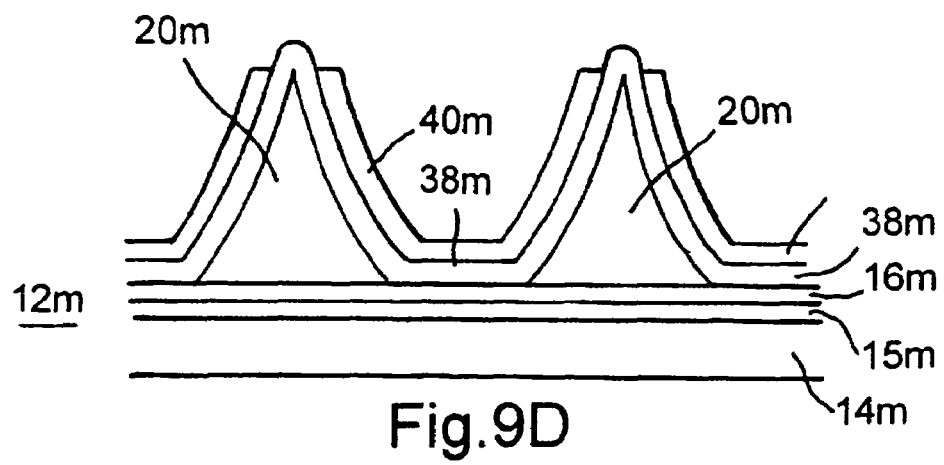

In the third step of the process, the plate arrangement is then etched by plasma means, in this case using CF (freon) gas. This results in the top of each emitter tip losing its metal and the SiN insulator layer 38m being exposed as is shown in FIG. 9D.

Figure 9E:
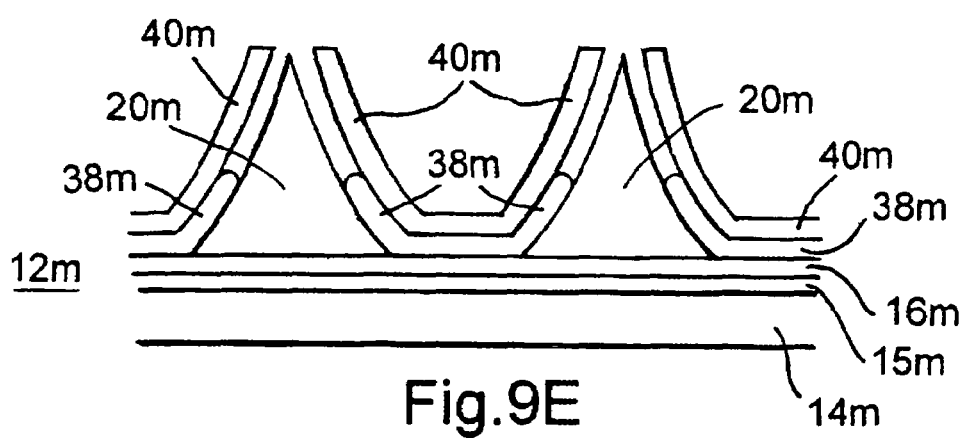

As is shown in FIG. 9E, the SiN insulator 38m is then etched leaving a supporting metal ring 41m around the exposed tip 20m which acts as a gate.

Figure 10A:
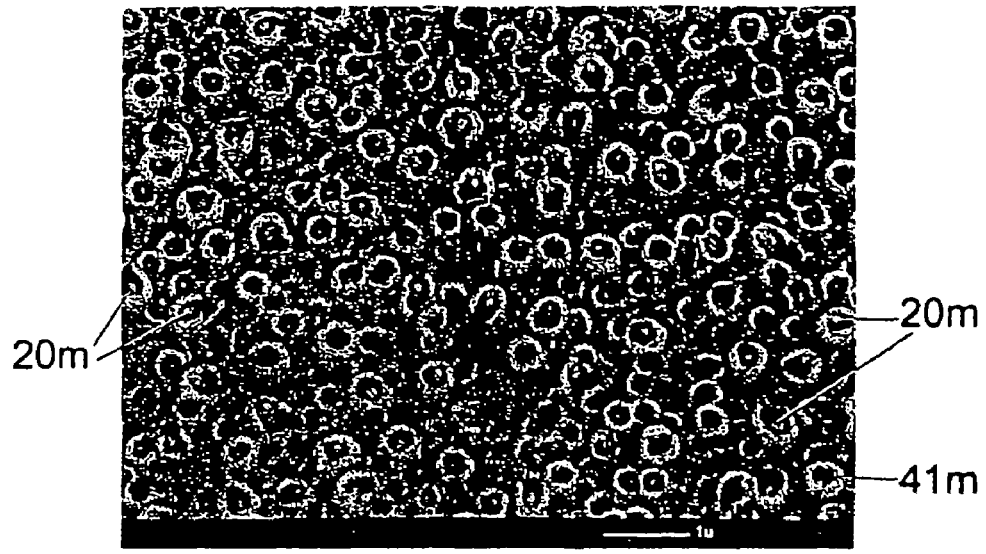
FIGS. 10A & 10B photographic images of the field emission backplate of FIGS. 9A-9E.
Figure 10B:
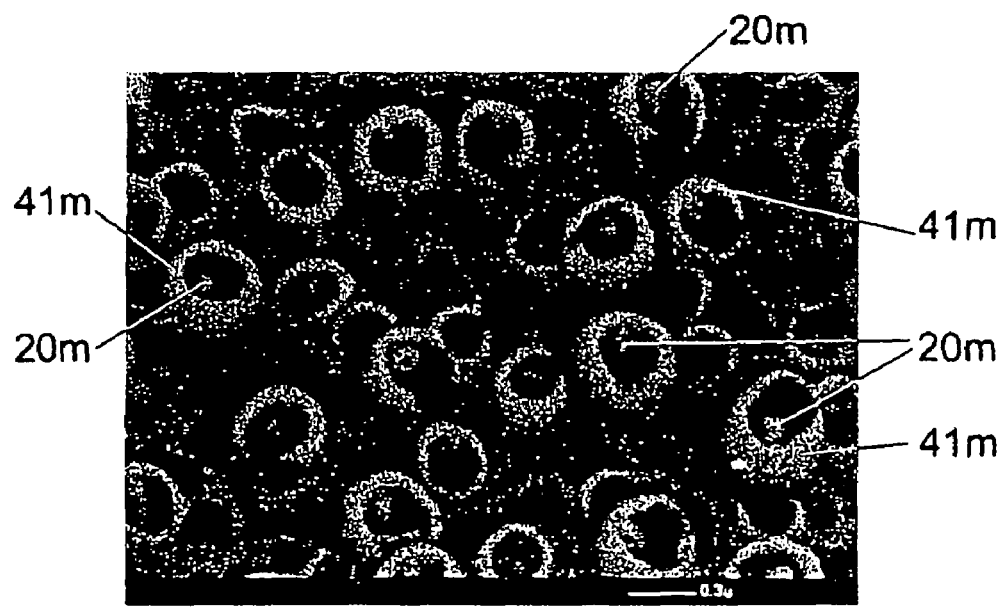

The resultant emission backplate 12m, which is shown in FIG. 10A and in a close-up image in FIG. 10B, can be used to form a field emission device 10m that is completely lithography free.

Figure 11A:
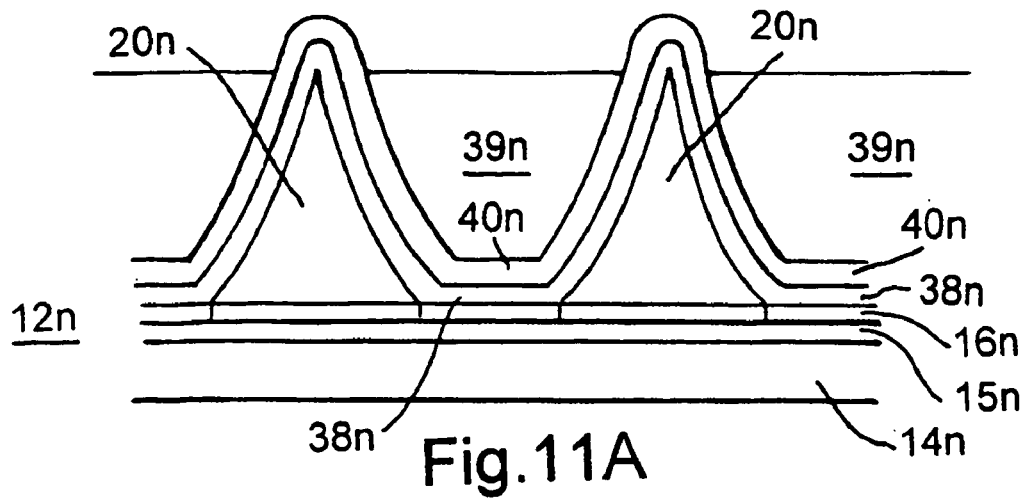
FIGS. 11A-11C a series of side cross-sectional views showing a method of forming a field emission backplate formed according to a seventh embodiment of the present invention including the use of a planarising agent.
Figure 11B:
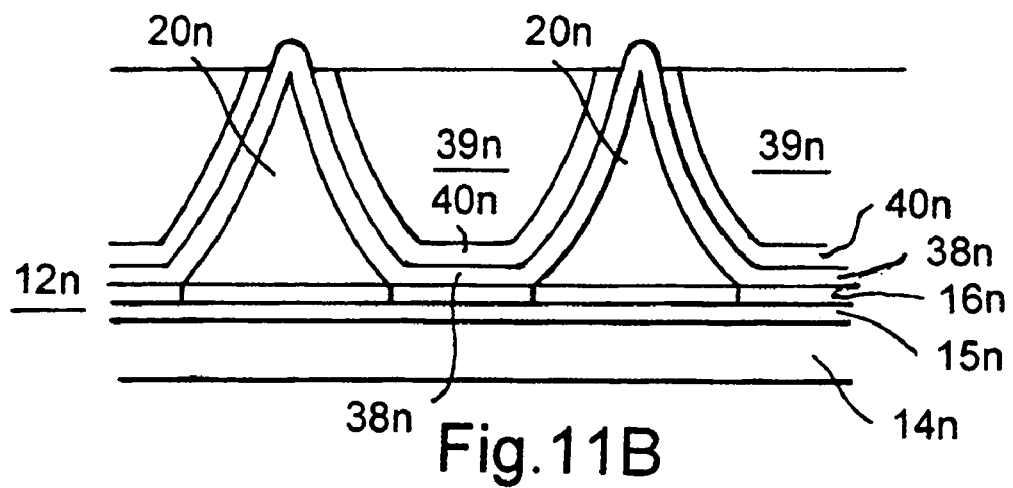
Figure 11C:
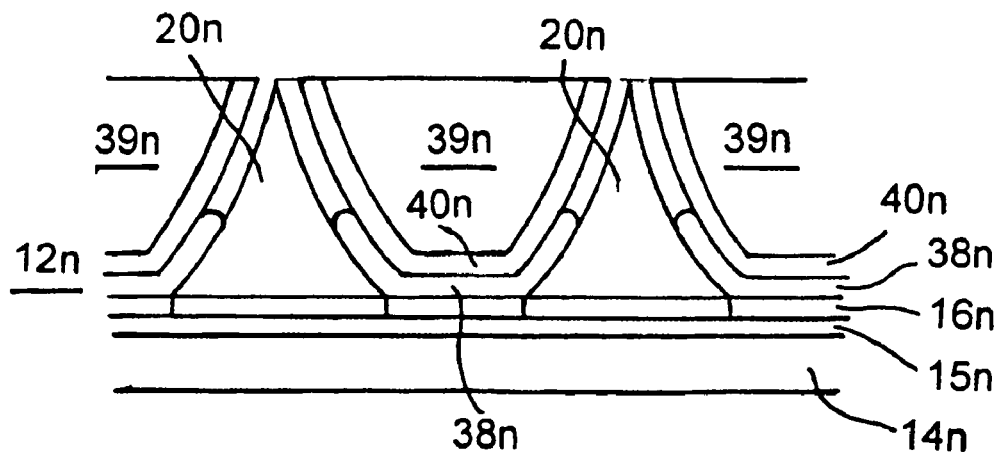

Referring to FIGS. 11A-11C, this process can be improved by applying a planarising agent 37n, that is a liquid which upon heating or solvent evaporation becomes a thin planar film, to the crystallised backplate 12n after the second step of the process resulting in an arrangement as illustrated in FIG. 11A. This shows the planarising agent 37n coating the backplate 12n leaving the emitter tips 20n standing proud.

The step of etching the arrangement by plasma means thus results in the arrangement shown in FIG. 11B.

The SiN insulator is then etched as before, leaving a space between the metal layer and the tip as is shown in FIG. 11C. By utilising the planarising agent 37n in this way the underlying silicon backplate structure is protected from corrosive etch effects. The planarising agent can then be removed resulting in a metal gate surrounding each tip as shown in FIGS. 10A and 10B.

Devices such as those detailed in the previous embodiments are suitable for many display applications due to their having low power consumption and being relatively simple to fabricate. Such devices may also be used as the cathodes for high power transistors for microwave amplifiers in the satellite and mobile communication markets.

Various modifications may be made to the embodiment of the invention as hereinbefore described without departing from the scope of the invention. For example, during the laser treatment of the thin film amorphous silicon 16a-m, the use of a single laser pulse has been described in locally crystallising the region, however, a number of pulses may alternatively be used thus allowing energies as low as 20 mJcm$^-$ to be used. Additionally, it has been described how the crystallisation of larger line or dot structures 21a-m can be used to grow spacers 22a-n during the selective etch and growth process of the tips 20a-m, however, silicon can also be grown in blocks on an insulator and thin film transistor devices for active address delineated in the same process.

The process of crystallising the thin film amorphous silicon 16a-n has been described as being performed by a pulsed laser, however, this may also be performed by other means such as intense electron beam irradiation or high energy ion beam/particle impact or even thermal annealing.

The depositing of the thin film of amorphous silicon 16a-m which may be intrinsic or doped n-type has been described by plasma enhanced chemical vapour deposition. However, the thin film may also be deposited by sputtering, evaporation or other such means.

The substrate 14a-m on which the thin film silicon 16a-m has been deposited has been described as aluminum, however, may alternatively be metal such as molybdenum, chromium, or similar. It should be noted that the electrode need not be formed integrally with the substrate 14a-m and may indeed be formed of a different material from the substrate 14a-m. Also the use of a Nd:YAG laser having 532 nm wavelength chosen to maximise absorption in silicon is detailed, however, any other wavelength can be used and, in particular, other wavelengths to maximise absorption in other appropriate semiconductor based materials can be used. The use of a transparent metal to form a diode configuration field emission device is described, however, a suitable conducting polymer may alternatively be used.

Furthermore TFT control circuitry can be fabricated in the same manner as the described field emission backplate 12a-m either at pixel level or via integrated peripheral drivers.

The thin film semiconductor in the detailed embodiments is an N-type hydrogenated amorphous silicon however the semiconductor may alternatively may be germanium or germanium alloy or similar. The substrate 14a-m on which the thin film semiconductor 16a-m is disposed has been detailed as being aluminium however may be formed of various other types of metal such as mobidium, chromium or similar. The use of a KrF (Krypton Fluorine) excimer laser is described however any excimer laser may be used.

Figure 8:
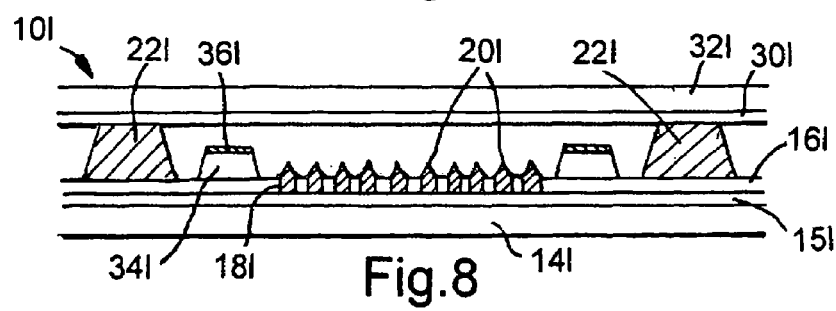
FIG. 8 a schematic side view of a field emission device having crystalline silicon tips according to a fifth embodiment of the present invention.

The device described in FIG. 8 is detailed as including a metal coated phosphor layer 301 disposed on a face plate 321, however, it should be understood that the other device embodiments detailed may also include this feature. Furthermore, each embodiment of the device 10a-m may be adapted to form a triode configuration by the deposition of an insulator 34a-m with a metal gate 36a-m placed above.

The silicon backplate described with reference to FIG. 9 is detailed as being crystallised using a Nd:YAG laser, however, it may be crystallised using an excimer laser and may be crystallised using a laser interferometry technique. Furthermore, the insulator 38m disposed on the crystallised silicon 16m is described as being SiN however it may be any suitable insulator and may be deposited using any conformal coating method. The layer of metal 40m disposed upon the insulator has been described as being deposited using thermal evaporation, however, sputtering or any other suitable technique may be used.

What is claimed is:

1. A field emission backplate comprising a planar body or thin film, the planar body or thin film comprising an amorphous semiconductor based material and a plurality of crystalline emitter sites formed by laser crystallization of respective portions of the planar body or thin film of amorphous semiconductor based material from exposure to at least one pulse laser interference pattern.

2. The field emission backplate of claim 1, wherein the semiconductor based material is silicon or an alloy thereof.

3. A field emission device comprising the field emission backplate of claim 1.

4. The field emission device of claim 3, wherein the field emission device is a vacuum device, wherein the emitter sites of the backplate act as an emission source in the device.

5. The field emission device of claim 4, further comprising a substrate, an evacuated space and a transparent window, wherein the field emission backplate is formed upon the substrate and the evacuated space is located between the field emission backplate and the thin film transparent window metal or metallised phosphor.

6. The field emission device of claim 3, further comprising a wide band-gap light emitting material into which the electrons from the emitter sites of the backplate are emitted in use.

7. The field emission device of claim 6, further comprising a substrate, the field emission backplate having formed on one side thereof the plurality of emitter sites, the wide band-gap light emitting material comprising a light emitting polymer, and a transparent metal or metallised phosphor, wherein the field emission backplate is formed upon the substrate, and one surface of the light emitting polymer is disposed on the plurality of emitter sites of the field emission backplate, the thin film transparent metal window being disposed on another surface of the light emitting polymer.

8. The field emission device of claim 3, wherein the device is a display device.

9. A method of forming the field emission backplate of claim 1 comprising:
providing a planar body of amorphous semiconductor based material upon a substrate; and
laser crystallizing portions of the amorphous semiconductor based material by exposure to at least one pulse laser interference pattern;
wherein upon crystallizing the portions of the amorphous semiconductor based material a plurality of emitter sites are formed on the amorphous semiconductor based material.

10. The method of claim 9, wherein the planar body of amorphous semiconductor based material is provided by depositing a thin film of material upon the substrate.

11. The method of claim 9, wherein the semiconductor based material is silicon or an alloy thereof.

12. The method of claim 9, wherein the step of performing laser crystallizing is conducted with an excimer or Nd:YAG laser.

13. The method of claim 12, wherein the excimer laser is a KrF laser.

14. A field emission backplate comprising a planar backplate member substantially comprising an amorphous semiconductor based material, the planar backplate member further comprising a plurality of grown tips substantially comprising a crystalline semiconductor based material formed by laser crystallization on the planar backplate member by exposure to at least one pulse laser interference pattern.

15. The field emission backplate of claim 14, wherein the substantially planar backplate comprises a thin film of amorphous semiconductor based material.

16. The field emission backplate of claim 14, wherein the amorphous semiconductor based material is silicon or an alloy thereof.

17. The field emission backplate of claim 14, wherein the plurality of tips are grown in an manner resulting in each having a sharp, pointed shape.

18. The field emission backplate of claim 14, wherein the plurality of tips are grown and etched simultaneously.

19. The field emission backplate of claim 14, wherein the crystalline semiconductor based material is a silicon.

20. The field emission backplate of claim 14, wherein each of the tips is formed on a respective crystallized area of the planar member.

21. A field emission device comprising the field emission backplate according to claim 14.

22. The field emission device of claim 21, wherein the plurality of grown tips comprise an array of profiled tips formed by the selective growth of crystalline semiconductor based material on a plurality of crystallized areas of the substantially planar backplate comprising a thin film of amorphous semiconductor based material.

23. The field emission device of claim 22, wherein the device is a vacuum device, and wherein tips act as an emission source in the device, in use.

24. The field emission device of claim 21, further comprising a substrate, an evacuated space and a transparent window, wherein the field emission backplate is formed upon the substrate and the evacuated space is located between the field emitting backplate and the transparent window.

25. The field emission device of claim 22, further comprising a wide band-gap light emitting material into which electrons from the tips are emitted.

26. The field emission device of claim 25, further comprising a substrate, the wide band-gap light emitting material, and a transparent window, wherein electrons from the tips are emitted into the wide band-gap light emitting material.

27. The field emission device of claim 26, wherein the wide bank-gap light emitting material is a light emitting polymer.

28. The field emission device of claim 26, wherein the transparent window is a thin film transparent metal.

29. The field emission device of claim 26, wherein one surface of the light emitting material is disposed on the plurality of tips of the field emission backplate and the transparent window is disposed on another surface of the light emitting material.

30. The field emission device of claim 22, wherein the device is a display device.

31. The field emission device of claim 22, wherein the tips of the field emission backplate are of a density of at least 100 per square micron.

32. A method of forming a field emission backplate according to claim 14, the method comprising:
    depositing a thin film of amorphous semiconductor based material upon a substrate;
    locally laser crystallizing a plurality of areas of the thin film amorphous semiconductor based material by exposure to at least one pulse laser interference pattern; and
    growing crystalline semiconductor based material upon each of the plurality of crystallized areas of thin film amorphous semiconductor based material.

33. The method of claim 32, further comprising the steps of depositing the thin film of amorphous semiconductor based material by plasma enhanced chemical vapor deposition.

34. A method of crystallizing areas of thin film amorphous semiconductor based material for use in the field emission backplate of claim 14, the method composing:
    forming a laser interferometer by splitting and recombining a laser beam;
    placing a thin film of amorphous semiconductor based material in the plane of the recombination of the laser beam;
    locally crystallizing areas of the thin film of amorphous semiconductor based material by subjecting the thin film to at least one laser pulse wherein the crystallized areas generated in the thin film amorphous semiconductor based material correspond to the interference pattern of the laser.

35. The method of claim 34, wherein for a backplate of amorphous semiconductor based material, wherein the semiconductor based material is hydrogenated amorphous silicon, the laser operates at a wavelength of around 532 nm to maximize absorption.

36. The method of claim 34, wherein the laser is a Nd:YAG laser.

* * * * *

UNITED STATES PATENT AND TRADEMARK OFFICE
CERTIFICATE OF CORRECTION

PATENT NO. : 7,592,191 B2  Page 1 of 1
APPLICATION NO. : 10/773696
DATED : September 22, 2009
INVENTOR(S) : Rose et al.

It is certified that error appears in the above-identified patent and that said Letters Patent is hereby corrected as shown below:

On Title Page:
Item (56) References Cited, FOREIGN PATENT DOCUMENTS, change "WO   EP 0 578 428   1/1994" to -- EP   EP 0 578 428   1/1994 --.

Column 12:
Line 6 (claim 34, line 3), change "composing:" to -- comprising: --.

Signed and Sealed this

Twenty-seventh Day of October, 2009

David J. Kappos
*Director of the United States Patent and Trademark Office*